(12) United States Patent
Hessler (10) Patent No.: US 9,428,382 B2
(45) Date of Patent: Aug. 30, 2016

(54) METHOD FOR MANUFACTURING A COMPOSITE COMPENSATING BALANCE SPRING

(71) Applicant: The Swatch Group Research and Development Ltd, Marin (CH)

(72) Inventor: Thierry Hessler, St Aubin (CH)

(73) Assignee: The Switch Group Research and Development Ltd., Marin (CH)

( * ) Notice: Subject to any disclaimer, the term of this patent is extended or adjusted under 35 U.S.C. 154(b) by 0 days.

(21) Appl. No.: 14/718,492

(22) Filed: May 21, 2015

(65) Prior Publication Data

US 2015/0344300 A1    Dec. 3, 2015

(30) Foreign Application Priority Data

Jun. 3, 2014 (EP) .................................... 14171012

(51) Int. Cl.
  *B81C 1/00* (2006.01)
  *G04B 17/22* (2006.01)
  *G04B 17/06* (2006.01)

(52) U.S. Cl.
  CPC ....... *B81C 1/00531* (2013.01); *B81C 1/00539* (2013.01); *G04B 17/06* (2013.01); *G04B 17/22* (2013.01); *G04B 17/227* (2013.01)

(58) Field of Classification Search
  None
  See application file for complete search history.

(56) References Cited

U.S. PATENT DOCUMENTS

| | | |
|---|---|---|
| 6,955,975 B2 | 10/2005 | Reichenbach et al. |
| 7,077,562 B2 | 7/2006 | Bourgeois et al. |
| 7,753,581 B2 | 7/2010 | Hessler et al. |
| 2004/0082145 A1 | 4/2004 | Reichenbach et al. |
| 2005/0281137 A1 | 12/2005 | Bourgeois et al. |
| 2009/0016173 A1 | 1/2009 | Hessler et al. |
| 2009/0236782 A1* | 9/2009 | Buhler ................. G04B 17/066 267/85 |

FOREIGN PATENT DOCUMENTS

| | | |
|---|---|---|
| CH | 706 252 B2 | 9/2013 |
| EP | 0 732 635 A1 | 9/1996 |
| EP | 1 422 436 A1 | 5/2004 |
| EP | 1 436 830 A1 | 7/2004 |
| EP | 1 791 039 A1 | 5/2007 |
| WO | 03/032377 A1 | 4/2003 |

OTHER PUBLICATIONS

European Search Report issued in corresponding application No. 14171012, completed Mar. 12, 2015.

* cited by examiner

*Primary Examiner* — Anita Alanko (74) *Attorney, Agent, or Firm* — Oblon, McClelland, Maier & Neustadt, L.L.P.

(57) ABSTRACT

A method for manufacturing a composite compensating balance spring is provided, the method including providing a first wafer made of a first material; providing at least one second wafer made of at least one second material having Young's modulus variations with temperature that are of opposite sign as those of the first material; joining the first wafer to the at least one second wafer to form a substrate; etching a pattern through the substrate to form a composite compensating balance spring including a first thickness of the first material and at least a second thickness of the at least one second material; and releasing the composite compensating balance spring from the substrate.

21 Claims, 5 Drawing Sheets

METHOD FOR MANUFACTURING A COMPOSITE COMPENSATING BALANCE SPRING

This application claims priority from European patent application No. 14171012.9 filed Jun. 3, 2014, the entire disclosure of which is hereby incorporated herein by reference.

FIELD OF THE INVENTION

The invention relates to a method for manufacturing a composite compensating balance spring and in particular such a balance spring intended to cooperate with a balance to form a thermocompensated resonator, i.e. whose frequency is insensitive or virtually insensitive to temperature variations.

BACKGROUND OF THE INVENTION

EP Patent No 1422436 discloses a balance spring formed of silicon and coated with silicon dioxide to render the thermal coefficient substantially zero around the temperatures of COSC procedures, i.e. between +8 and −38° C. The silicon oxide is generally obtained by oxidising the silicon core which makes industrial manufacture of compensating balance springs possible.

However, other pairs of materials may be envisaged, but are more difficult to secure to each other and thus to produce.

SUMMARY OF THE INVENTION

It is an object of the present invention to overcome all or part of the aforecited drawbacks by proposing an alternative method for manufacturing composite compensating balance springs which permits a greater possible range of materials than simply silicon with silicon dioxide.

To this end, according to a first embodiment, the invention relates to a method for manufacturing a composite compensating balance spring including the following steps:
a) taking a first wafer made of a first material;
b) taking at least a second wafer made of at least a second material whose Young's modulus variations with temperature are of the opposite sign to those of the first material;
c) joining or bonding the first wafer to said at least one second wafer so as to form a substrate;
d) etching a pattern through the substrate to form a composite compensating balance spring including a first thickness of said first material and at least a second thickness of said at least second material;
e) releasing the composite compensating balance spring from the substrate.

Further, according to a second embodiment, the invention relates to a method for manufacturing a composite compensating balance spring including the following steps:
a) taking a first wafer made of a first material;
b) taking at least a second wafer made of at least a second material whose Young's modulus variations with temperature are of the opposite sign to those of the first material;
d') etching identical patterns through each of the wafers;
c') joining or bonding the first wafer to said at least one second wafer to form a substrate and, by superposition of said same patterns, forming a composite compensating balance spring including a first thickness of said first material and at least a second thickness of said at least second material;
e) releasing the composite compensating balance spring from the substrate.

Finally, according to a third embodiment, the invention relates to a method for manufacturing a composite compensating balance spring including the following steps:
a) taking a first wafer made of a first material;
b) taking at least a second wafer made of at least a second material whose Young's modulus variations with temperature are of the opposite sign to those of the first material;
f) etching identical patterns in each of the wafers in only part of the thickness;
g) joining or bonding the first wafer to said at least one second wafer to form a substrate by superposition of said same patterns;
f') etching said identical patterns in the rest of the substrate to form a composite compensating balance spring including a first thickness of said first material and at least a second thickness of said at least second material;
e) releasing the composite compensating balance spring from the substrate.

Advantageously according to the invention, a large variety of materials can thus be used to form composite compensating balance springs in an industrial manner. Depending on the materials used, at least one of the three embodiments can be used to manufacture a composite compensating balance spring including a first thickness $E_1$ of said first material and at least a second thickness $E_2$ of said at least second material.

In accordance with other advantageous variants of the invention:
- the first material and/or said at least one second material is silicon-based and includes single crystal silicon, doped single crystal silicon, polycrystalline silicon, doped polycrystalline silicon, porous silicon, silicon oxide, quartz, silica, silicon nitride or silicon carbide;
- the first material and/or said at least one second material is ceramic-based and includes photostructurable glass, borosilicate, aluminosilicate, quartz glass, lithium aluminosilicate glass-ceramic (sold by Schott AG under the trademark ZERODUR®), single crystal corundum, polycrystalline corundum, alumina, aluminium oxide, aluminium nitride, single crystal ruby, polycrystalline ruby, zirconium oxide, titanium oxide, titanium nitride, titanium carbide, tungsten nitride, tungsten carbide, boron nitride or boron carbide;
- the first material and/or said at least one second material is metal-based and includes an iron alloy, a copper alloy, nickel or an alloy thereof, titanium or an alloy thereof, gold or an alloy thereof, silver or an alloy thereof, platinum or an alloy thereof, ruthenium or an alloy thereof, rhodium or an alloy thereof, or palladium or an alloy thereof;
- several composite compensating balance springs are formed on the same substrate.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

As explained above, the invention relates to a method for manufacturing a composite compensating balance spring intended to form a thermocompensated resonator of the sprung-balance type.

By way of definition, the relative frequency variation of a resonator follows the relationship below:

$$\frac{\Delta f}{f_0} = A + \alpha \cdot (T - T_0) + \beta \cdot (T - T_0)^2 + \gamma \cdot (T - T_0)^3$$

where:

$$\frac{\Delta f}{f_0}$$

is the relative frequency variation (ppm or $10^{-6}$);

A is a constant which depends upon the point of reference (ppm);

T is the measurement temperature (° C.);

$T_0$ is the reference temperature (° C.);

$\alpha$ is the first order thermal coefficient (ppm. ° C.$^{-1}$);

$\beta$ is the second order thermal coefficient (ppm. ° C.$^{-2}$);

$\gamma$ is the third order thermal coefficient (ppm. ° C.$^{-3}$).

Moreover, the thermo-elastic coefficient (TEC) represents the relative Young's modulus variation with temperature. The thermal coefficient, i.e. the relative variation in the resonator frequency as a function of temperature, depends on the thermo-elastic coefficient of the resonator body and the expansion coefficients of the body. Further, the thermal coefficient also takes account of coefficients specific to the balance (which forms a fly-wheel) for a sprung-balance resonator. As the oscillations of any resonator intended for a time or frequency base have to be maintained, the thermal coefficient also includes any contribution from the maintenance system such as an escapement mechanism.

The most important parameter is therefore the thermo-elastic coefficient (TEC) which should not be confused with the "CTE", i.e. the constant of thermal expansion which concerns the expansion coefficient.

It is an object of the invention to be able to manufacture a large variety of composite compensating balance springs including at least two joined or bonded materials whose Young's modulus variations with temperature (TEC) are of opposite signs.

Further, said at least two materials may also optionally include an intermediate material intended to promote the bonding of two materials that are difficult to attach. Thus, depending on the bonding technique selected, this intermediate material may be likened to a braze intended to attach two materials to each other by joint adherence to the intermediate material, or form a layer intended to produce sufficiently intense heat to cause the two materials to melt. Of course, in the case of the use of such an optional intermediate material, the latter must also be taken into account for overall compensation of the thermal coefficient of the oscillator.

Figure 1:
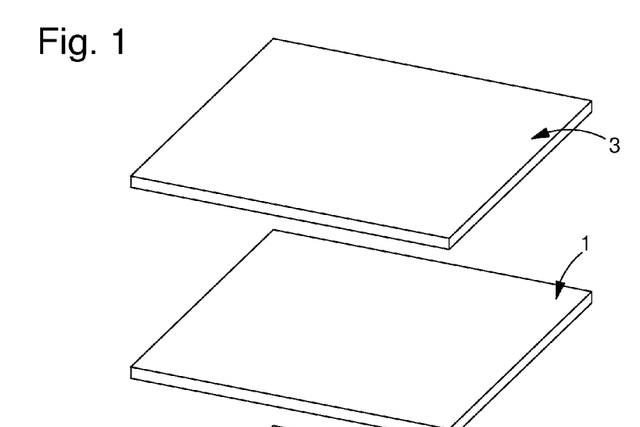
FIGS. 1 to 3 are views of steps of a first embodiment of the invention using two wafers.
Figure 2:
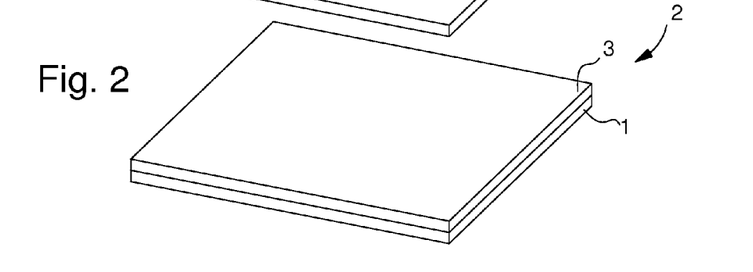
Figure 3:
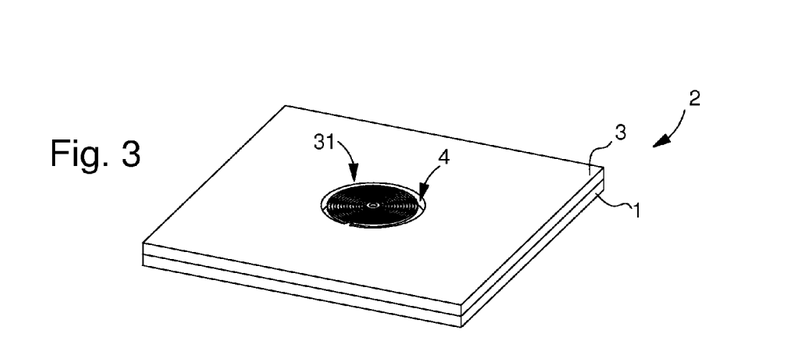

According to a first embodiment of the invention illustrated in FIGS. 1 to 3, the manufacturing method includes a first step a) intended to take a first wafer 1 made of a first material. A second step b) is intended to take at least a second wafer 3 made of at least a second material whose Young's modulus variations with temperature (TEC) are of the opposite sign to those (TEC) of the first material.

As seen in FIG. 2, a third step c) is intended to join or bond the first wafer 1 to said at least one second wafer 3 in order to form a substrate 2. Depending on the materials used, there are several possible bonding methods. In a non-limiting manner, one may mention the direct welding of surfaces by electromagnetic radiation using a laser, as, for example, explained in EP Patent No 1436830, which is incorporated by reference in this description. It is also perfectly possible to envisage using anodic bonding, fusion bonding, thermocompression bonding, reflow bonding, eutectic bonding, ultrasonic bonding or thermosonic bonding.

The method according to the first embodiment continues with a fourth step d) intended to etch a pattern 4 through the substrate to form a composite compensating balance spring 31 including a first thickness $E_1$ of said first material and at least a second thickness $E_2$ of said at least second material. Depending on the materials used, there are several possible etches. In a non-limiting manner, a dry etch such as a deep reactive ionic etching (DRIE), laser etching or a plasma etching may be mentioned. It is also perfectly possible to envisage using a wet etching, such as a chemical etching. Finally, it is also possible to perform photostructuration, combining photolithography of a resin followed by a dry etching or wet etching.

Figure 11:
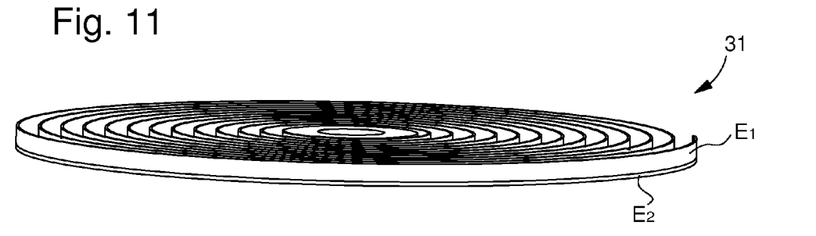
FIG. 11 is a perspective view of a composite compensating balance spring obtained according to one of the three embodiments of the invention using two wafers.

Finally, the method includes a final step e) intended to release the composite compensating balance spring 31 from the substrate. Advantageously according to the invention, a large variety of materials can thus be used to form composite compensating balance springs in an industrial manner. As illustrated in FIG. 11, composite compensating balance spring 31 includes a first thickness $E_1$ of said first material and at least a second thickness $E_2$ of said at least second material.

Figure 4:
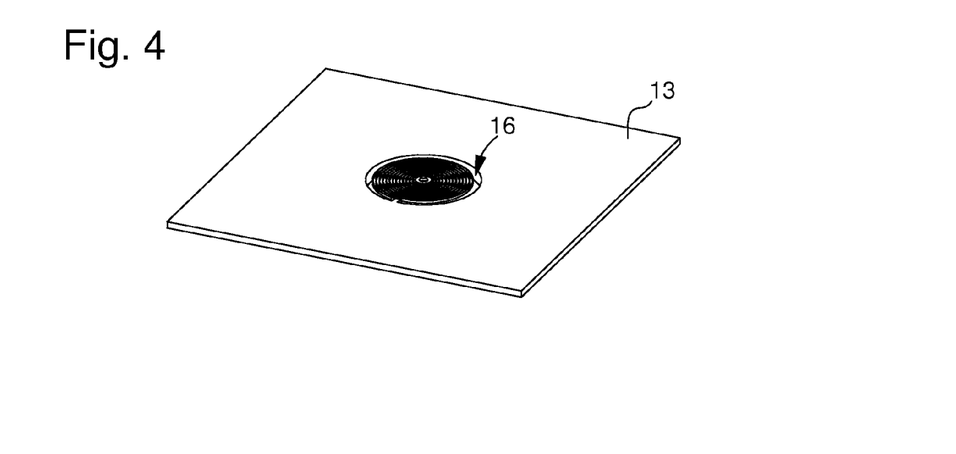
FIGS. 4 to 6 are views of steps of a second embodiment of the invention using two wafers.
Figure 5:
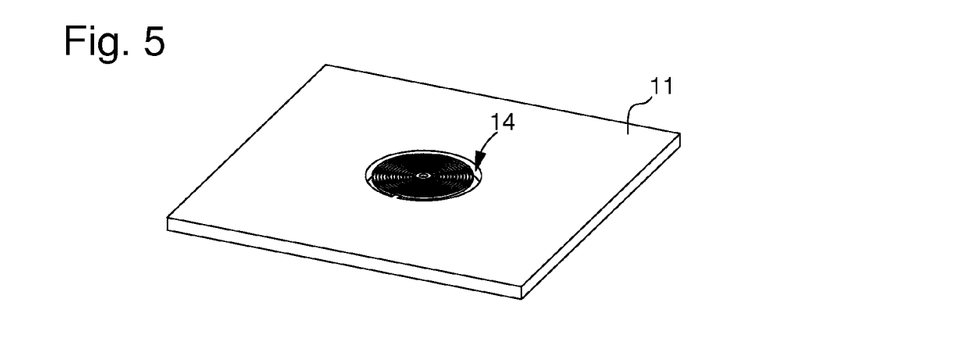
Figure 6:
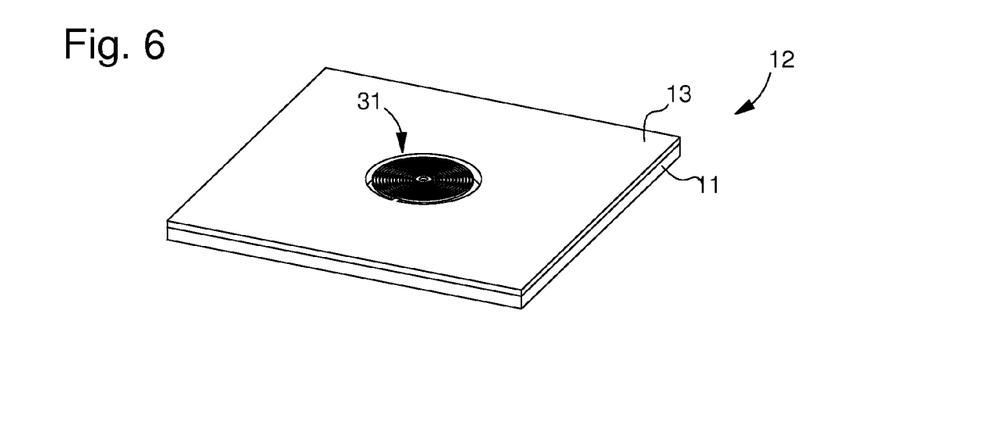

According to a second embodiment of the invention illustrated in FIGS. 4 to 6, the manufacturing method includes a first step a) intended to take a first wafer 11 of a first material. A second step b) is intended to take at least a second wafer 13 made of at least a second material whose Young's modulus variations with temperature (TEC) are of the opposite sign to those (TEC) of the first material.

As seen in FIGS. 4 and 5, a third step d') is intended to etch identical patterns 14, 16 through each of wafers 11, 13. Depending on the materials used, there are several possible etches. In a non-limiting manner, a dry etching such as a deep reactive ionic etching (DRIE), laser etching or a plasma etching may be mentioned. It is also perfectly possible to envisage using a wet etching, such as a chemical etching.

Finally, it is also possible to perform photostructuration mixing photolithography of a resin followed by a dry etching or wet etching.

The method according to the second embodiment continues with a fourth step c') intended to join or bond the first wafer 11 to said at least one second wafer 13 to form a substrate 12 and, by superposition of said same patterns 14, 16, to form a composite balance spring 31 including a first thickness $E_1$ of said first material and at least a second thickness $E_2$ of said at least second material.

Depending on the materials used, there are several possible bonding methods. In a non-limiting manner, one may mention the direct welding of surfaces by electromagnetic radiation using a laser, as, for example, explained in EP Patent No 1436830, which is incorporated by reference in this description. It is also perfectly possible to envisage using anodic bonding, fusion bonding, thermocompression bonding, reflow bonding, eutectic bonding, ultrasonic bonding or thermosonic bonding.

Finally, the method includes a final step e) intended to release the composite compensating balance spring 31 from the substrate. Advantageously according to the invention, a large variety of materials can thus be used to form composite compensating balance springs in an industrial manner. As illustrated in FIG. 11, composite compensating balance spring 31 includes a first thickness $E_1$ of said first material and at least a second thickness $E_2$ of said at least second material.

According to a third embodiment of the invention illustrated in FIGS. 7 to 10, the manufacturing method includes a first step a) intended to take a first wafer 21 made of a first material. A second step b) is intended to take at least a second wafer 23 made of at least a second material whose Young's modulus variations with temperature (TEC) are of the opposite sign to those (TEC) of the first material.

Figure 7:
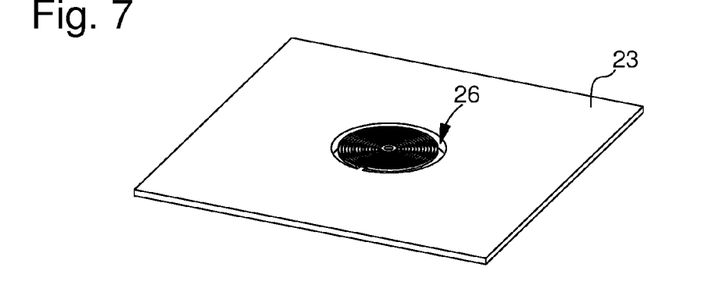
FIGS. 7 to 10 are views of steps of a third embodiment of the invention using two wafers.
Figure 8:
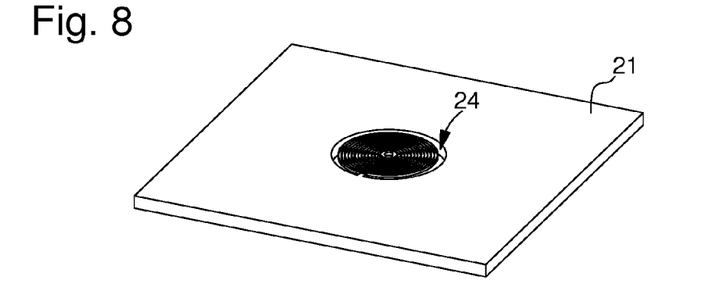

As seen in FIGS. 7 and 8, a third step f) is intended to etch identical patterns 24, 26 in each of the wafers 21, 23 in only one part of the thickness of said wafer 21, 23. In a non-limiting manner, a dry etching such as a deep reactive ionic etching (DRIE), laser etching or a plasma etching may be mentioned. It is also perfectly possible to envisage using a wet etching, such as a chemical etching. Finally, it is also possible to perform photostructuration mixing photolithography of a resin followed by a dry etching or wet etching.

Figure 9:
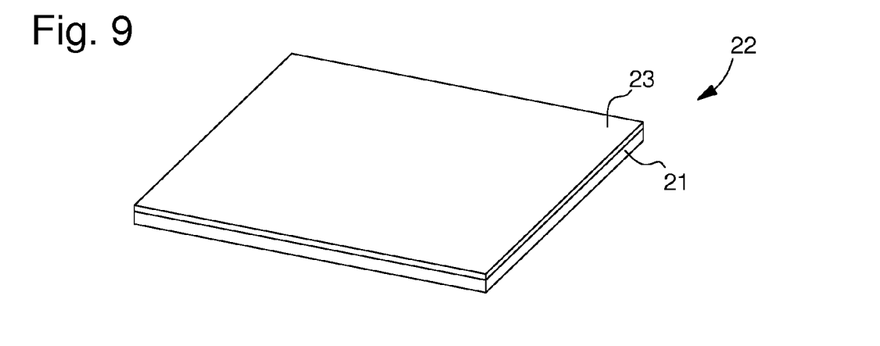

The method according to the third embodiment continues with a fourth step g) intended to join or bond the first wafer 21 to said at least one second wafer 23 to form a substrate 22 by superposition of said same patterns as seen in FIG. 9. Depending on the materials used, there are several possible bonding methods. In a non-limiting manner, one may mention the direct welding of surfaces by electromagnetic radiation using a laser, as, for example, explained in EP Patent No 1436830, which is incorporated by reference in this description. It is also perfectly possible to envisage using anodic bonding, fusion bonding, thermocompression bonding, reflow bonding, eutectic bonding, ultrasonic bonding or thermosonic bonding.

Figure 10:
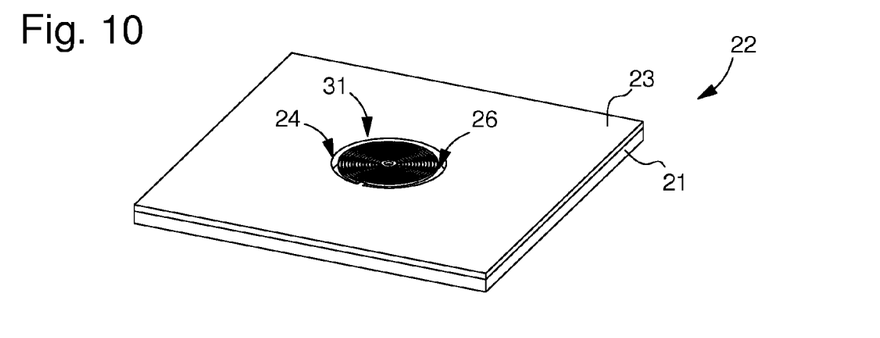

The method according to the third embodiment continues with a fifth step f') intended to etch said identical patterns 24, 26 in the rest of substrate 22 to form a composite compensating balance spring 31 including a first thickness $E_1$ of said first material and at least a second thickness $E_2$ of said at least second material. Step f') may be achieved with the same techniques mentioned for step f) above.

Finally, the method includes a final step e) intended to release composite compensating balance spring 31 from the substrate 22. Advantageously according to the invention, a large variety of materials can thus be used to form composite compensating balance springs in an industrial manner. This third embodiment may be particularly useful when the expansion values of the two bodies usually make them difficult to assemble to each other. As illustrated in FIG. 11, composite compensating balance spring 31 includes a first thickness $E_1$ of said first material and at least a second thickness $E_2$ of said at least second material.

Advantageously according to the invention, at least one of the three embodiments can be used, according to the material used, to manufacture a composite compensating balance spring 31 including a first thickness $E_1$ of said first material and at least a second thickness $E_2$ of said at least second material. It is also understood that several composite compensating balance springs 31 may be made on the same substrate 2, 12, 22, each composite compensating balance spring may be made in the same pattern 4, 14, 16, 24, 26 or in distinct patterns.

Preferably according to the invention, the first material and/or said at least one second material is silicon-based or ceramic-based. Thus, when the first material and/or said at least one second material is silicon-based, it/they may preferably include single crystal silicon, doped single crystal silicon, polycrystalline silicon, doped polycrystalline silicon, porous silicon, silicon oxide, quartz, silica, silicon nitride or silicon carbide.

Whereas, when the first material and/or said at least one second material is ceramic-based, it/they may preferably include photostructurable glass, borosilicate, aluminosilicate, quartz glass, lithium aluminosilicate glass-ceramic (sold by Schott AG under the trademark ZERODUR®), single crystal corundum, polycrystalline corundum, alumina, aluminium oxide, aluminium nitride, single crystal ruby, polycrystalline ruby, zirconium oxide, titanium oxide, titanium nitride, titanium carbide, tungsten nitride, tungsten carbide, boron nitride or boron carbide.

Finally, when the first material and/or said at least one second material is metal-based, it/they may include an iron alloy like 15P, 20AP or 316L steels, a copper alloy such as brass, a nickel alloy such as nickel silver, titanium or an alloy thereof, gold or an alloy thereof, silver or an alloy thereof, platinum or an alloy thereof, ruthenium or an alloy thereof, rhodium or an alloy thereof, or palladium or an alloy thereof.

Figure 12:
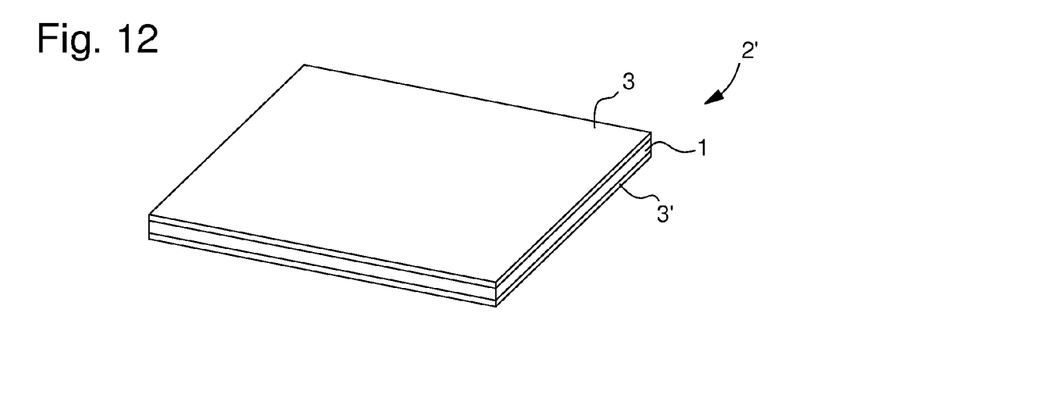
FIGS. 12 and 13 are views of steps of an alternative of the first embodiment of the invention using more than two wafers.
Figure 13:
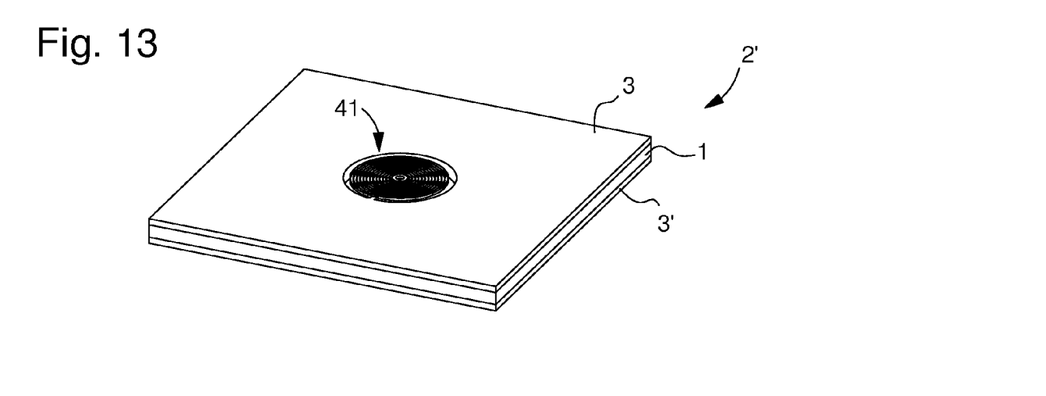
Figure 14:
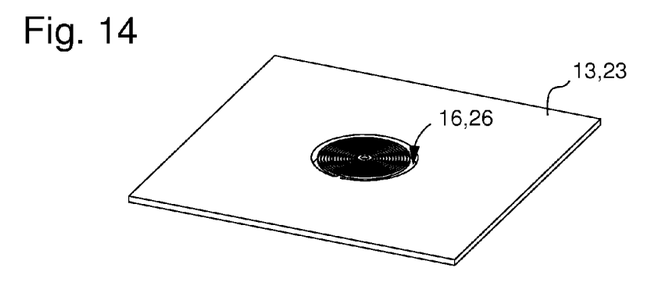
FIGS. 14 to 17 are views of steps of an alternative of the second and third embodiments of the invention using more than two wafers.
Figure 15:
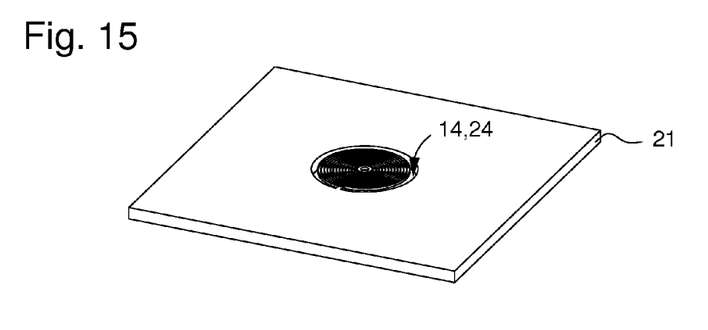
Figure 16:
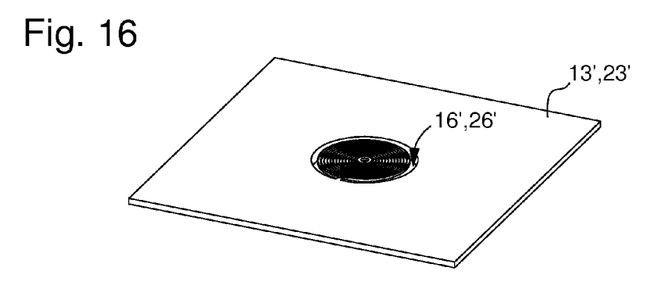
Figure 17:
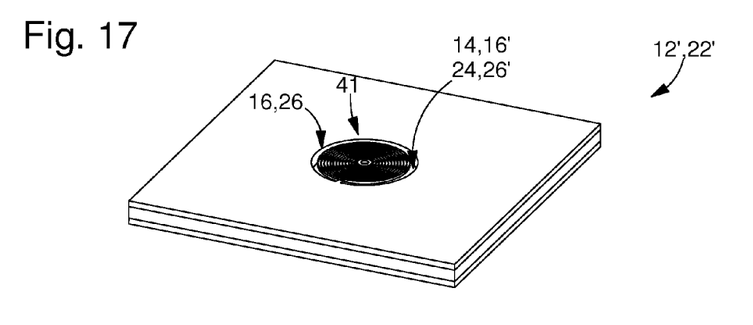

According to an alternative of the first embodiment illustrated in FIGS. 12 and 13, step b) may consist in forming several second wafers 3, 3' formed from the same material or from several different materials. The Figures illustrate two wafers, however, a larger number of second wafers may be provided.

Figure 18:
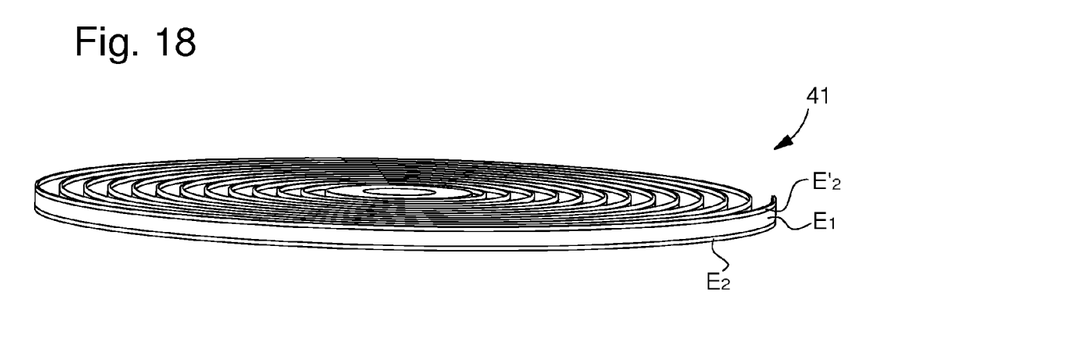
FIG. 18 is a perspective view of a composite compensating balance spring obtained according to one of the three embodiments of the invention using more than two wafers.

In this alternative of the first embodiment, it is thus understood that there is obtained, in step c), a substrate 2' with three joined or bonded wafers 3, 1, 3' as illustrated in FIG. 12. As seen in FIG. 13, the etching step d) then makes it possible to form a composite compensating balance spring 41 including a first thickness $E_1$ of said first material and two second thicknesses $E_2$, $E'_2$ formed from the same material or from several different materials. Such a composite compensating balance spring 41 is shown in FIG. 18.

According to an alternative of the second and third embodiments illustrated in FIGS. 14 to 17, step b) may consist in forming several second wafers 13, 13', 23, 23' formed from the same material or from several different materials. The Figures illustrate two wafers, however, a larger number of second wafers may be provided.

In this alternative of the second and third embodiments, it is thus understood that there is obtained in step c') or g) a substrate 12', 22' with three joined or bonded wafers 13, 11, 13', 23, 21, 23'. As seen in FIG. 13, etching step d'), f) or f') then makes it possible to form a composite compensating balance spring 41 including a first thickness $E_1$ of said first material and two second thicknesses $E_2$, $E'_2$ formed from the same material or from several different materials. Such a composite compensating balance spring 41 is shown in FIG. 18.

Of course, the present invention is not limited to the illustrated example but is capable of various variants and modifications that will appear to those skilled in the art. In particular, other applications for a resonator can be achieved by those skilled in the art without excessive difficulty from the above teaching. By way of example, a tuning fork, or more generally a MEMS resonator could be formed in place of a composite compensating balance spring.

It is also possible to envisage using alternative joining or bonding methods, such as adhesive bonding or brazing, and/or alternative etching methods such as mechanical machining, water jet cutting or a combination of water jet and laser cutting.

What is claimed is:

1. A method for manufacturing a composite compensating balance spring, comprising:
   providing a first wafer made of a first material;
   providing at least one second wafer made of at least one second material having Young's modulus variations with temperature that are of opposite sign as those of the first material;
   joining the first wafer to the at least one second wafer to form a substrate;
   etching a pattern through the substrate to form a composite compensating balance spring including a first thickness of the first material and at least a second thickness of the at least one second material; and
   releasing the composite compensating balance spring from the substrate.

2. The method according to claim 1, wherein the first material and/or the at least one second material is silicon-based.

3. The method according to claim 2, wherein the first material and/or the at least one second material includes single crystal silicon, doped single crystal silicon, polycrystalline silicon, doped polycrystalline silicon, porous silicon, silicon oxide, quartz, silica, silicon nitride, or silicon carbide.

4. The method according to claim 1, wherein the first material and/or the at least one second material is ceramic-based.

5. The method according to claim 4, wherein the first material and/or the at least one second material includes photostructurable glass, borosilicate, aluminosilicate, quartz glass, lithium aluminosilicate glass-ceramic, single crystal corundum, polycrystalline corundum, alumina, aluminium oxide, aluminium nitride, single crystal ruby, polycrystalline ruby, zirconium oxide, titanium oxide, titanium nitride, titanium carbide, tungsten nitride, tungsten carbide, boron nitride, or boron carbide.

6. The method according to claim 1, wherein the first material and/or the at least one second material is metal-based.

7. The method according to claim 6, wherein the first material and/or the at least one second material includes an iron alloy, a copper alloy, nickel or an alloy thereof, titanium or an alloy thereof, gold or an alloy thereof, silver or an alloy thereof, platinum or an alloy thereof, ruthenium or an alloy thereof, rhodium or an alloy thereof, or palladium or an alloy thereof.

8. A method for manufacturing a composite compensating balance spring, comprising:
   providing a first wafer made of a first material;
   providing at least one second wafer made of at least one second material having Young's modulus variations with temperature that are of opposite sign as those of the first material;
   etching identical patterns through each of the first wafer and the at least one second wafer;
   joining the first wafer to the at least one second wafer to form a substrate and, by superposition of the etched identical patterns, forming a composite compensating balance spring including a first thickness of the first material and at least a second thickness of the at least one second material; and
   releasing the composite compensating balance spring from the substrate.

9. The method according to claim 8, wherein the first material and/or the at least one second material is silicon-based.

10. The method according to claim 9, wherein the first material and/or the at least one second material includes single crystal silicon, doped single crystal silicon, polycrystalline silicon, doped polycrystalline silicon, porous silicon, silicon oxide, quartz, silica, silicon nitride, or silicon carbide.

11. The method according to claim 8, wherein the first material and/or the at least one second material is ceramic-based.

12. The method according to claim 11, wherein the first material and/or the at least one second material includes photostructurable glass, borosilicate, aluminosilicate, quartz glass, lithium aluminosilicate glass-ceramic, single crystal corundum, polycrystalline corundum, alumina, aluminium oxide, aluminium nitride, single crystal ruby, polycrystalline ruby, zirconium oxide, titanium oxide, titanium nitride, titanium carbide, tungsten nitride, tungsten carbide, boron nitride, or boron carbide.

13. The method according to claim 8, wherein the first material and/or the at least one second material is metal-based.

14. The method according to claim 13, wherein the first material and/or the at least one second material includes an iron alloy, a copper alloy, nickel or an alloy thereof, titanium or an alloy thereof, gold or an alloy thereof, silver or an alloy thereof, platinum or an alloy thereof, ruthenium or an alloy thereof, rhodium or an alloy thereof, or palladium or an alloy thereof.

15. A method for manufacturing a composite compensating balance spring, comprising:
   providing a first wafer made of a first material;
   providing at least one second wafer made of at least one second material having Young's modulus variations with temperature that are of opposite sign as those of the first material;
   etching identical patterns in each of the first wafer and the at least one second wafer, and in only one part of the respective thicknesses thereof;
   joining the first wafer to the at least one second wafer to form a substrate by superposition of the etched identical patterns;
   etching additional identical patterns, identical to the etched identical patterns, in the rest of the substrate to form a composite compensating balance spring including a first thickness of the first material and at least a second thickness of the at least one second material; and releasing the composite compensating balance spring from the substrate.

16. The method according to claim 15, wherein the first material and/or the at least one second material is silicon-based.

17. The method according to claim 16, wherein the first material and/or the at least one second material includes single crystal silicon, doped single crystal silicon, polycrystalline silicon, doped polycrystalline silicon, porous silicon, silicon oxide, quartz, silica, silicon nitride, or silicon carbide.

18. The method according to claim 15, wherein the first material and/or the at least one second material is ceramic-based.

19. The method according to claim 18, wherein the first material and/or the at least one second material includes photostructurable glass, borosilicate, aluminosilicate, quartz glass, lithium aluminosilicate glass-ceramic, single crystal corundum, polycrystalline corundum, alumina, aluminium oxide, aluminium nitride, single crystal ruby, polycrystalline ruby, zirconium oxide, titanium oxide, titanium nitride, titanium carbide, tungsten nitride, tungsten carbide, boron nitride, or boron carbide.

20. The method according to claim 15, wherein the first material and/or the at least one second material is metal-based.

21. The method according to claim 20, wherein the first material and/or the at least one second material includes an iron alloy, a copper alloy, nickel or an alloy thereof, titanium or an alloy thereof, gold or an alloy thereof, silver or an alloy thereof, platinum or an alloy thereof; ruthenium or an alloy thereof, rhodium or an alloy thereof, or palladium or an alloy thereof.

* * * * *